United States Patent [19]
Itoh et al.

[11] Patent Number: 5,965,942
[45] Date of Patent: Oct. 12, 1999

[54] SEMICONDUCTOR MEMORY DEVICE WITH AMORPHOUS DIFFUSION BARRIER BETWEEN CAPACITOR AND PLUG

[75] Inventors: Yasuyuki Itoh, Chiba; Shigeo Onishi, Nara; Jun Kudo, Nara; Keizo Sakiyama, Nara, all of Japan

[73] Assignee: Sharp Kabushiki Kaisha, Osaka, Japan

[21] Appl. No.: 08/851,895

[22] Filed: May 6, 1997

Related U.S. Application Data

[63] Continuation-in-part of application No. 08/458,966, Jun. 2, 1995, abandoned.

[30] Foreign Application Priority Data

Sep. 28, 1994 [JP] Japan ..................................... 6-232654

[51] Int. Cl.⁶ ................................................. H01L 27/108
[52] U.S. Cl. ........................... 257/761; 257/769; 257/295
[58] Field of Search ..................................... 257/295, 298, 257/303, 306, 310, 751, 753, 761, 769

[56] References Cited

U.S. PATENT DOCUMENTS

| | | | |
|---|---|---|---|
| 5,504,041 | 4/1996 | Summerfelt | 437/235 |
| 5,525,837 | 6/1996 | Choudhury | 257/751 |
| 5,576,579 | 11/1996 | Agnello et al. | 257/751 |
| 5,633,781 | 5/1997 | Saenger et al. | 257/296 |

FOREIGN PATENT DOCUMENTS

| | | |
|---|---|---|
| 62-89355 | 4/1987 | Japan . |
| 4-85878 | 3/1992 | Japan . |

*Primary Examiner*—David B. Hardy
*Attorney, Agent, or Firm*—Nixon & Vanderhye, P.C.

[57] ABSTRACT

In a semiconductor memory device, a tantalum silicon nitride film or hafnium silicon nitride film is provided, as a diffusion barrier layer, between a polysilicon plug which electrically connects a source/drain region to a lower platinum electrode of a capacitor, formed on a silicon substrate, and the lower platinum electrode.

The tantalum silicon nitride film has a composition of $Ta_XSi_{1-X}N_Y$ wherein $0.75 \leq X \leq 0.95$ and $1.0 \leq Y \leq 1.1$.

The hafnium silicon nitride film has a composition of $Hf_XSi_{1-X}N_Y$ wherein $0.2 < X < 1.0$ and $0 < Y < 1.0$.

2 Claims, 3 Drawing Sheets

SEMICONDUCTOR MEMORY DEVICE WITH AMORPHOUS DIFFUSION BARRIER BETWEEN CAPACITOR AND PLUG

This application is a CIP of Ser. No. 08/458,966 filed Jun. 2, 1995, now abandoned.

BACKGROUND OF THE INVENTION

1. Field of the Invention

The present invention relates to a semiconductor memory device, and particularly to a semiconductor memory device with a dielectric film which is constructed from a ferroelectric thin film material or a high-dielectric thin film material.

2. Description of the Related Art

Recently, much study has been made of semiconductor memory devices which use high-dielectric thin films with greater dielectric constants than silicon oxide films, and semiconductor memory devices which use ferroelectric thin films with spontaneous polarization. High-dielectric materials and ferroelectric materials are generally oxides; more specifically, high-dielectric materials include STO ($SrTiO_3$, strontium titanate), BSTO ($(Ba, Sr)TiO_3$, barium strontium titanate), etc., and ferroelectric materials include PZT ($Pb(Zr, Ti)O_3$, lead zirconate titanate), $PbTiO_3$ (lead titanate), $BaTiO_3$ (barium titanate), PLZT ($(Pb, La)(Zr, Ti)O_3$, lead lanthanum zirconate titanate), of which PZT is presently under intense investigation as the most promising material for non-volatile memory devices.

FIG. 4 is a sectional view of an example of the prior art semiconductor memory devices. The semiconductor memory devices of the prior art, which use a high-dielectric material or ferroelectric material as the dielectric film of the capacitor, have a stacked structure which comprises, for example, a dielectric capacitor consisting of a lower electrode 28, a dielectric film 29 and an upper electrode 30 and is formed on a pass transistor consisting of a gate electrode 23 and a source/drain region 24, with a reduced memory cell region which serves to accomplish high integration, as illustrated in FIG. 4. In order to implement such a stacked structure, it is necessary to form a plug-structured wire 26 connecting the pass transistor and the dielectric capacitor. In FIG. 4, 21 denotes a semiconductor substrate (e.g., n-type silicon substrate), 22 denotes a LOCOS oxide film for element isolation, 25 and 31 denote layer insulator films and 32 denotes an electrode.

At present polysilicon and tungsten are widely used as plug materials for minute contact holes. Tungsten plugs, however, have the drawback that they tend to cause contact failures in drain regions during thermal processing because of their great localized stress, and are readily oxidized and sublimate in an oxidizable atmosphere, and therefore polysilicon plugs are preferably used. In addition, platinum is used as the lower electrode material for the dielectric capacitor for its excellent oxidation resistance and low reactivity.

Processes for the formation of high-dielectric films or ferroelectric films for dielectric capacitors inevitably involve their processing in a high-temperature oxidizing atmosphere at 500° C.–700° C. to cause their crystallization for high dielectric constants or ferroelectricity. Problems which arise when they are used to fabricate highly integrated memory devices include reaction of the lower platinum electrode of the capacitor and the polysilicon plug or the tungsten plug due to the high temperature during the process for the fabrication of dielectric films, occurrence of contact failures due to oxidation of the plug, deterioration of the transistor characteristics due to diffusion of platinum, lead from the dielectric film, etc. For these reasons, it becomes necessary to interpose a conductive, diffusion barrier layer which is thermally stable and is a large barrier against oxygen, platinum, lead and the like, between the plug and the lower platinum electrode.

As an example, ITO film, Ti film or TiN film is used as the diffusion barrier layer in Japanese Unexamined Patent Application Disclosure HEI 4-85878. The ITO film deteriorates at 500° C. or higher temperatures, and particularly its resistance increases at 600° C. or the sintering temperature of the ferroelectric substance, while the Ti film and TiN film, when subjected to oxygen annealing at 600° C., undergo oxidation of the diffusion barrier layer which causes deterioration of its conductivity and delamination thereof.

On the other hand, use of titanium, titanium nitride film or the like as the diffusion barrier layer presents a problem that oxygen, lead, platinum, etc. tend to diffuse through the grain boundary due to their columnar crystal structure, and the film thickness is required to be 2000 A or greater in order to obtain satisfactory barrier characteristics. The increased film thickness naturally causes increase in the step height of the capacitor region, thus preventing high integration and bringing a serious obstacle against their practical use.

SUMMARY OF THE INVENTION

It is an object of the present invention to provide a semiconductor memory device with lowered increase in the step height of the capacitor region, excellent contact with the polysilicon plug, etc., and remarkable barrier characteristics.

According to the invention, there is provided a semiconductor memory device equipped with a capacitor with a lower platinum electrode and a transistor connected with the lower electrode through a conductive plug, characterized by comprising a conductive, amorphous diffusion barrier layer between the lower electrode and the conductive plug.

The invention also provides a semiconductor memory device equipped with a capacitor comprising a ferroelectric film or high-dielectric film between an upper electrode and a lower electrode, and a transistor connected with the lower electrode through a conductive plug, characterized by comprising a conductive, amorphous diffusion barrier layer between the lower electrode and the conductive plug. Preferably, the aforementioned semiconductor memory device comprises a tantalum silicon nitride film or hafnium silicon nitride film as the diffusion barrier layer.

According to the invention, the diffusion barrier layer is a tantalum silicon nitride film having a composition of $Ta_xSi_{1-x}N_Y$ wherein $0.76 \leq X \leq 0.93$ and $1.0 \leq Y \leq 1.1$. In this case, it is preferable that the diffusion barrier layer has a thickness equal to or less than 1000 A.

Furthermore, according to the invention, the diffusion barrier layer is a hafnium silicon nitride film having a composition of $Hf_xSi_{1-x}N_Y$ wherein $0.2 < X < 1$ and $0 < Y \leq 1$.

With the aforementioned construction, the diffusion barrier layer with an amorphous structure has no grain boundary, and thus exhibits remarkable diffusion barrier characteristics against oxygen, lead, platinum, etc.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
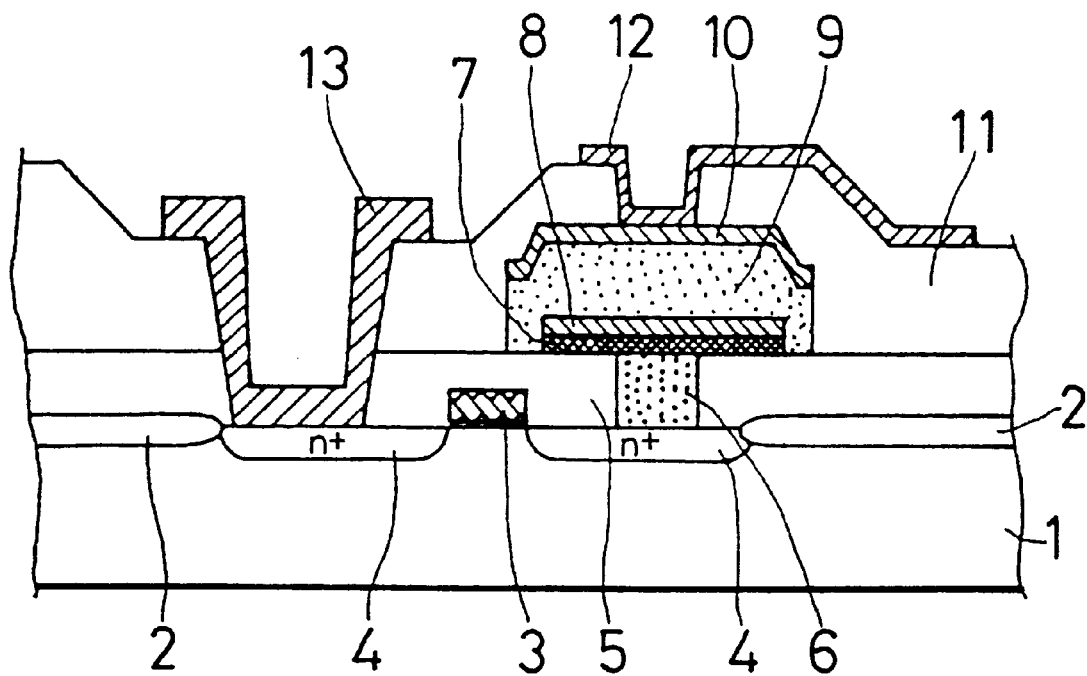
FIG. 1 is a sectional view of the construction of the semiconductor memory device according to an embodiment of the invention.

Now referring to the drawings, preferred embodiments of the invention are described below.

FIG. 1 is a sectional view of the construction of the semiconductor memory device according to an embodiment of the present invention. In FIG. 1, 1 is a n-type silicon substrate; 2 is a LOCOS oxide film for element isolation which is formed on the surface of the silicon substrate 1; 3 is a gate electrode; 4 is a source/drain region; 5 is a first silicon oxide film which is formed as an interlayer insulator film on the silicon substrate 1; 6 is a polysilicon plug which is formed for making contact between the silicon substrate 1 and a lower platinum electrode 8; 7 is a tantalum silicon nitride film which is formed as the diffusion barrier layer on the polysilicon plug 6; 8 is a lower platinum electrode which is formed on the tantalum silicon nitride film 7; 9 is a PZT film which is a ferroelectric thin film formed on the lower platinum electrode 8; 10 is an upper platinum electrode which is formed on the PZT film 9; 11 is a second silicon oxide film which is formed as an interlayer insulator film; 12 is a first aluminum leading electrode which is formed for making contact with the upper platinum electrode 10; and 13 is a second aluminum leading electrode which is formed for making contact with the silicon substrate 1. Here, it is to be noted that although the present embodiment is explained with reference to a n-type silicon substrate, the invention is by no means limited to the use thereof.

An explanation will now be given regarding the process for the fabrication of the semiconductor memory device according to an embodiment of the invention which is shown in FIG. 1.

First, the LOCOS oxide film 2 is formed on the surface of the silicon substrate 1 to the film thickness of approximately 5000 A for the formation of an element isolation region. Then, after a pass transistor comprising the gate electrode 3, the source/drain region 4, etc. is formed, the first silicon oxide film 5 with approximately 5000 A thickness is formed as an interlayer insulator film by the CVD method, after which is formed a contact hole with a diameter of 0.5 $\mu$m.

Then, after burying polysilicon into the contact hole by the CVD method, the surface is made flat by the CMP method to form the polysilicon plug 6.

Next, after the amorphous tantalum silicon nitride film 7 with a film thickness of 1000 A is formed on the polysilicon plug 6 by the RF magnetron reactive sputtering method, the tantalum silicon nitride film 7 is stabilized by treatment with RTA in an atmosphere of nitrogen.

The formed tantalum silicon nitride film 7 should have the composition: $Ta_xSi_{1-x}N_y$ wherein $0.76 \leq X \leq 0.93$, and $1.0 \leq Y \leq 1.1$ This treatment with RTA may not always be necessary, depending on the film formation conditions. The conditions for the formation of the tantalum silicon nitride film 7 are: target alloy of $Ta_{0.67}Si_{0.33}$; substrate temperature of 200° C.; sputtering power of 1,000 W; sputtering gas pressure of 5 m Torr; and $Ar/N_2$ flow ratio of 10:1. The conditions for the treatment with RTA are as follows: rate of temperature increase in a pure nitrogen atmosphere being 80° C./sec.; holding temperature of 600° C.; and holding time of 1 min. The tantalum silicon nitride film 7 formed under the aforementioned conditions has been confirmed to have an amorphous structure by X-ray diffraction analysis, and further has been confirmed to have the composition ratio of $Ta_{0.81}Si_{0.19}N_{1.06}$ by Auger Electron Spectroscopy.

Then, after a platinum film with a film thickness of 500 A has been formed by the DC magnetron sputtering method, the amorphous tantalum silicon nitride film 7 and the platinum film are processed to, for example, a size of 2 $\mu$m square by dry etching with chlorine gas so that the platinum film forms the lower platinum electrode 8.

Then, the PZT film 9 with a thickness of 2000 A is formed by a sol/gel method.

The aforementioned method of forming the PZT film involves, first, preparation of a sol/gel starting material solution by dissolving lead acetate, titanium (IV) isopropoxide and zirconium isopropoxide at a ratio of Pb:Ti:Zr= 100:52:48 in 2-methoxyethanol as the solvent, application of the resulting starting material solution with a spinner at 3,000 rpm, drying it at 150° C. for 10 minutes in the air, and presintering at 400° C. for 30 minutes in the air. Thereafter, the film is subjected to crystallization at 600° C.–650° C. for 30 minutes in an atmosphere of a mixture of nitrogen and oxygen. This sequence of application, drying, and presintering may be repeated for a number of times. Here, the flow ratio of nitrogen and oxygen is nitrogen:oxygen=4:1.

Then, after a platinum film with a film thickness of 500 A has been formed by the DC magnetron sputtering method the PZT film 9 is processed by ion milling with argon gas or dry etching with $CF_4$ gases, and the upper platinum electrode 10, by dry etching with chlorine gas, to a size of 2.6 $\mu$m square, for example. Thereafter, the second silicon oxide film 11 is formed as an interlayer insulator film by the CVD method, after which a contact hole is formed, followed by formation of the first aluminum leading electrode 12 from the upper platinum electrode 10 of the ferroelectric capacitor and the second aluminum leading electrode 13 from the silicon substrate 1 by the DC magnetron sputtering method.

Figure 2:
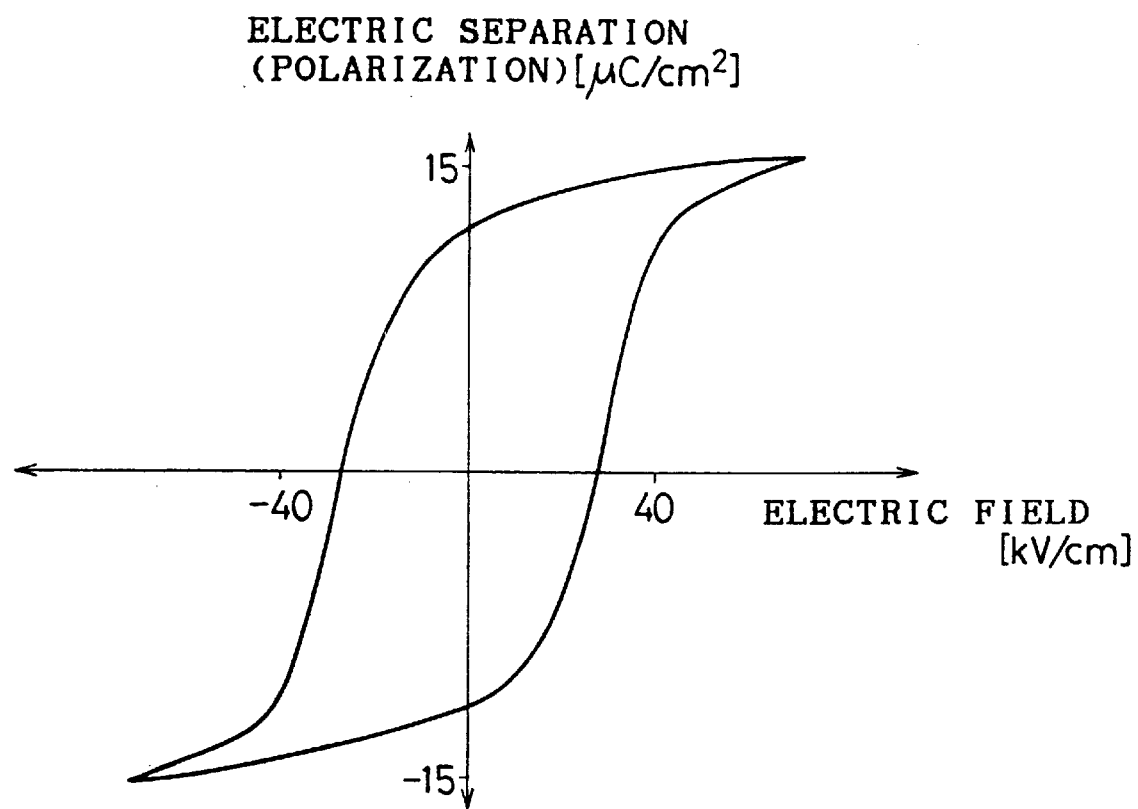
FIG. 2 is a view illustrative of the hysteresis loop of the semiconductor memory device of the invention which is shown in FIG. 1.

The hysteresis loop shown in FIG. 2 is obtained as a result of application of a triangular wave between the aluminum leading electrode 12 from the upper platinum electrode 10 of the capacitor with a ferroelectric film which has been prepared in the foregoing steps and the aluminum leading electrode 13 from the silicon substrate 1. The applied triangular wave has an amplitude of 150 kV/cm at a frequency of 75 Hz. FIG. 2 shows that the resulting ferroelectric characteristics are sufficient to support its use as a ferroelectric capacitor, and that good contact is established between the silicon substrate 1 and lower platinum electrode 8 since the symmetry of the hysteresis loop is not impaired. In addition, secondary electron microscopic examination of a section of the present device has revealed that no reaction occurs between the respective layers.

In addition, after the PZT film 9 has been formed by the above method, the PZT film 9 is removed by hydrogen fluoride, and a leading electrode from the lower platinum electrode 8 is formed and a contact resistance between the silicon substrate 1 and lower platinum electrode 8 of approximately 100 ohms or less is obtained from measurement.

Furthermore, compositions of the tantalum silicon nitride films 7 and contact resistances are measured with respect to ten compositions of Ta-Si target alloys as shown in Table 1, in order to clarify the relationship of the compositions of the tantalum silicon nitride films 7 with the contact resistances. The measurement is carried out under the same conditions as in the foregoing measurement.

TABLE 1

|  | Composition of alloy | composition of nitride film | contact resistance |
|---|---|---|---|
| 1 | $Ta_{0.9}Si_{0.1}$ | $Ta_{0.95}Si_{0.05}N_{1.02}$ | 148 ($\Omega$) |
| 2 | $Ta_{0.83}Si_{0.17}$ | $Ta_{0.92}Si_{0.08}N_{1.03}$ | 95 |
| 3 | $Ta_{0.77}Si_{0.23}$ | $Ta_{0.87}Si_{0.13}N_{1.04}$ | 90 |
| 4 | $Ta_{0.71}Si_{0.29}$ | $Ta_{0.85}Si_{0.15}N_{1.05}$ | 92 |
| 5 | $Ta_{0.67}Si_{0.33}$ | $Ta_{0.81}Si_{0.19}N_{1.06}$ | 90 |
| 6 | $Ta_{0.62}Si_{0.38}$ | $Ta_{0.79}Si_{0.21}N_{1.07}$ | 90 |
| 7 | $Ta_{0.59}Si_{0.41}$ | $Ta_{0.76}Si_{0.24}N_{1.08}$ | 102 |
| 8 | $Ta_{0.56}Si_{0.44}$ | $Ta_{0.74}Si_{0.26}N_{1.09}$ | 170 |
| 9 | $Ta_{0.53}Si_{0.47}$ | $Ta_{0.72}Si_{0.28}N_{1.10}$ | 285 |
| 10 | $Ta_{0.5}Si_{0.5}$ | $Ta_{0.69}Si_{0.31}N_{1.10}$ | 380 |

Figure 3:
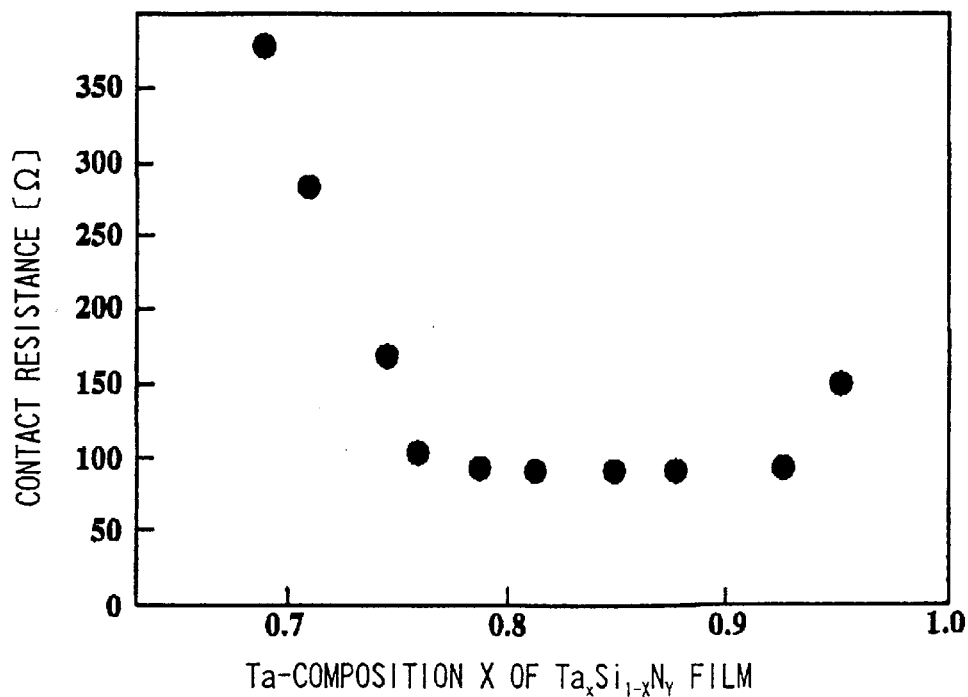
FIG. 3 is a graph illustrative of the relation between X of $Ta_xSi_{1-x}N_y$ film used for the diffusion barrier layer and contact resistances.
Figure 4:
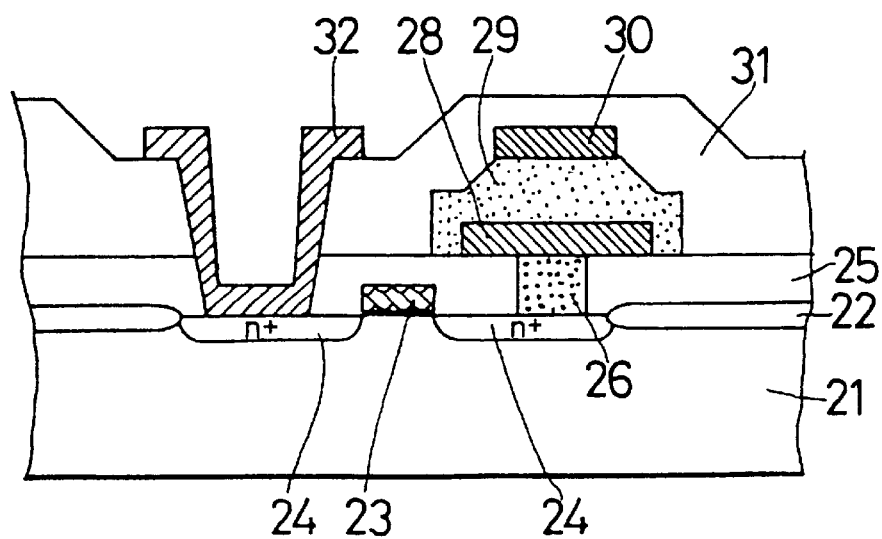
FIG. 4 is a sectional view of the construction of a stack-type semiconductor memory device of a prior art.

In addition, the relation between X of the tantalum silicon nitride film $Ta_XSi_{1-X}N_Y$ and the contact resistances is shown in FIG. 3.

It is seen from Table 1 and FIG. 3 that, when X takes on values in the range of 0.76 to 0.93, preferable resistance values are obtained, and when X takes on values out of the range, the contact resistance values increase drastically. It is because, in the case where X exceeds a value of 0.93, the amorphousness of the tantalum silicon nitride film is destroyed and grain boundaries are formed, resulting in decrease of the barrier property and increase of contact resistances due to diffusion of oxygen in the formation of the PZT film, and in the case where X is a value less than 0.76, the silicon in the tantalum silicon nitride film is oxidized, resulting in increase of the contact resistances. Therefore, X of the tantalum silicon nitride film $Ta_XSi_{1-X}N_Y$ as a diffusion barrier layer provided in a lower part of the lower electrode of the high-dielectric memory capacitor should take on values in the range of 0.76 to 0.93, wherein Y is in the range of 1.00 to 1.10.

As the diffusion barrier layer may be used a hafnium silicon nitride film having a composition of $Hf_XSi_{1-X}N_Y$, wherein X and Y are in the ranges of 0.2<X<1, and 0<Y≦1, respectively. In order to obtain the hafnium silicon nitride films of such compositions, target alloys of $Hf_{0.9}Si_{0.1}$, $Hf_{0.7}Si_{0.3}$, $Hf_{0.625}Si_{0.375}$, $Hf_{0.5}Si_{0.5}$, and $Hf_{0.3}Si_{0.7}$ are preferable. When X reaches a value of 1, the amorphousness is destroyed and grain boundaries are formed, resulting in decrease of the barrier property and decrease of the contact resistances due to the diffusion of oxygen in the formation of the PZT film. On the other hand, when X is not a value more than 0.2, silicon reacts with the lower electrode material of platinum. Therefore hafnium silicon nitride films of such compositions are not preferable as a diffusing barrier.

Although the sol/gel method is used in forming the dielectric film in the above embodiment, methods such as vacuum evaporation, reactive magnetron sputtering, and MOCVD may also be used. In addition, although a PZT film is used as the ferroelectric thin film in the above embodiment, the same degrees of excellent diffusion barrier effects are provided by other ferroelectric thin films made from $PbTiO_3$, $(Pb_xLa_{1-x})TiO_3$, $(Pb_xLa_{1-x})(Zr_yTi_{1-y})O_3$, $Bi_4Ti3O_{12}$, $BaTiO_3$, $BaMgF_4$, $LiNbO_3$, $LiTaO_3$, $SrBi_2Ti_2O_9$, $YMnO_3$, $Sr_2Nb_2O_7$, etc., or other high-dielectric thin films made from $(Ba_xSr_{1-x})TiO_3$, $SrBi_4Ti_4O_{15}$ or the like. It is further to be noted that although platinum is used as the lower electrode material in the above embodiment, the use of other metals, nitrides, conductive oxides such as $RuO_2$ or $IrO_2$ may produce the same effects as well; this applies also to the case where tungsten or the like is used instead of the polysilicon as the contact plug material.

As detailed above, according to the invention, since the diffusion barrier layer has an amorphous structure, no grain boundary is present therein, for which reason there are provided remarkable diffusion barrier characteristics against oxygen, lead, platinum, etc. This allows provision of a 1,000 A or less thick diffusion barrier layer which serves to lower increase in the step height of the capacitor region, and thus it is extremely effective to accomplish high integration of devices. Additionally, no problems, (including delamination), occur since the barrier layer also has good intimate contact with the polysilicon plug and silicon oxide film.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor memory device comprising:

a capacitor having a lower electrode formed of platinum;

a transistor;

a conductive plug connecting the transistor with the lower electrode; and a diffusion barrier layer interposed between the lower electrode and the conductive plug, said diffusion barrier layer being conductive and amorphous in structure, the diffusion barrier layer being composed of a hafnium silicon nitride film having a composition of $Hf_XSi_{1-X}N_Y$ wherein 0.2<X<1 and 0<Y≦1.

2. A semiconductor memory device comprising:

a capacitor having a lower electrode, an upper electrode, and a ferroelectric or high-dielectric film formed between the foregoing electrodes;

a transistor;

a conductive plug connecting the transistor with the lower electrode; and a diffusion barrier layer interposed between the lower electrode and the conductive plug, said diffusion barrier layer being conductive and amorphous in structure, the diffusion barrier layer being composed of a hafnium silicon nitride film having a composition of $Hf_XSi_{1-X}N_Y$ wherein 0.2<X<1 and 0<Y≦1.

* * * * *